(12) United States Patent
Jue et al.

(10) Patent No.: US 12,031,873 B2
(45) Date of Patent: Jul. 9, 2024

(54) PROCESS AND MISMATCH INSENSITIVE TEMPERATURE SENSOR

(71) Applicant: Silicon Laboratories Inc., Austin, TX (US)

(72) Inventors: Peh Sheng Jue, Singapore (SG); Jeffrey L. Sonntag, Weaverville, NC (US)

(73) Assignee: Silicon Laboratories Inc., Austin, TX (US)

( * ) Notice: Subject to any disclaimer, the term of this patent is extended or adjusted under 35 U.S.C. 154(b) by 505 days.

(21) Appl. No.: 17/504,760

(22) Filed: Oct. 19, 2021

(65) Prior Publication Data

US 2023/0121535 A1 Apr. 20, 2023

(51) Int. Cl.
  *G01K 7/00* (2006.01)
  *H03H 7/06* (2006.01)
  *H03F 3/45* (2006.01)
(52) U.S. Cl.
  CPC ........... *G01K 7/00* (2013.01); *H03H 7/06* (2013.01); *H03F 3/45475* (2013.01)
(58) Field of Classification Search
  CPC ...................................................... G01K 7/00
  USPC ........................................................ 327/512
  See application file for complete search history.

(56) References Cited

U.S. PATENT DOCUMENTS

2022/0228928 A1* 7/2022 Hu .................. H03M 3/456

OTHER PUBLICATIONS

Pertijs et al., "A CMOS Smart Temperature Sensor With a 3σ Inaccuracy of ± 0.1° C. From -55° C. to 125° C.", IEEE Journal of Solid-State Circuits, vol. 40, No. 12, pp. 2805-2815, Dec. 2005.
Tuthill, "A Switched-Current, Switched-Capacitor Temperature Sensor in 0.6-μm CMOS", IEEE Journal of Solid-State Circuits, vol. 33, No. 7, pp. 1117-1122, Jul. 1998.
Zhu et al., "A 0.058mm² 24μW Temperature Sensor in 40nm CMOS Process With ±0.5° C. Inaccuracy From -55 to 175° C.", Circuits, Systems, and Signal Processing, vol. 37, No. 6, 2017.

* cited by examiner

*Primary Examiner* — Tomi Skibinski
(74) *Attorney, Agent, or Firm* — NIELDS, LEMACK & FRAME, LLC (57) ABSTRACT

A temperature sensor that is insensitive to process variation and mismatch is disclosed. The temperature sensor includes a PTAT voltage generator, a sampling and gain boosting circuit, a filter and a controller. The PTAT voltage generator utilizes a plurality of current sources, each of which is in electrical communication with the same diode, or diode stack. The output of the PTAT voltage generator is sampled and amplified with the sampling and gain boosting circuit. The output of the sampling and gain boosting circuit is then filtered using a low pass filter. The selection of the current mirrors, the sampling timing and other signals are provided by the controller. In some simulations, the output from the temperature sensor was accurate to within 1.5° C., using a one temperature calibration process.

19 Claims, 8 Drawing Sheets

PROCESS AND MISMATCH INSENSITIVE TEMPERATURE SENSOR

This disclosure describes a system and method of sensing temperature that is insensitive to process variations.

BACKGROUND

Temperature sensors are used in many devices. In many embodiments, conventional sensors, such as thermistors or platinum resistors are used to produce accurate results. However, there is a desire to incorporate temperature sensors in smart devices, such that the temperature sensor is created using a traditional CMOS process.

However, sensors that are built using CMOS processes may have inaccuracies due to process variation, component mismatch, and other factors. One approach is to create a voltage that is accurately proportional to absolute temperature (PTAT) and use this voltage as an indicator of temperature. Various techniques have been utilized to use this voltage as the basis of a temperature sensor.

However, other factors within the CMOS device may affect the accuracy of this sensor. For example, process variation (across wafers and dies) and mismatch variation (across parts) of devices, such as bipolar transistors (BJTs), resistors and capacitors, may affect the sensor. Another factor is that operational amplifiers, also known as opamps, often have an offset voltage between their two input terminals that may affect the final result.

Therefore, it would be beneficial if there was a temperature sensor that was insensitive to these mismatches. This not only achieves good accuracy, but also eliminates the need for or allows a simpler calibration process in production test, which translates to cost/time savings. Further, it would be advantageous if the temperature sensor could be easily incorporated into a CMOS device.

SUMMARY

A temperature sensor that is insensitive to process variation and mismatch is disclosed. The temperature sensor includes a PTAT voltage generator, a sampling and gain boosting circuit, a filter and a controller. The PTAT voltage generator utilizes a plurality of current sources, each of which is in electrical communication with the same diode, or diode stack. The output of the PTAT voltage generator is sampled and amplified with the sampling and gain boosting circuit. The output of the sampling and gain boosting circuit is then filtered using a low pass filter. The selection of the current mirrors, the sampling timing and other signals are provided by the controller. In some simulations, the output from the temperature sensor was accurate to within 1.5° C., using a one temperature calibration process.

According to one embodiment, a temperature sensor is disclosed. The temperature sensor comprises a proportional to absolute temperature (PTAT) voltage generator, to generate a reference voltage during an auto-zero stage and a plurality of sampling voltages during a sampling stage, wherein a difference between the reference voltage and each of the plurality of sampling voltages is defined as a ΔV voltage; a sampling and gain boosting circuit to amplify a plurality of ΔV voltages; and a filter to average the plurality of ΔV voltages. In some embodiments, the PTAT voltage generator comprises a diode and a plurality of current sources each with a respective switch such that when the switch is closed, current from the current source flows through the diode, and wherein when all of the respective switches are closed, the reference voltage is generated. In some embodiments, the plurality of current sources comprises at least 4 current sources. In certain embodiments, the plurality of current sources comprises between 8 and 20 current sources. In some embodiments, when one switch is closed, one of the plurality of sampling voltages is generated. In certain embodiments, the temperature sensor comprises a controller, wherein the controller generates a plurality of PHASE signals, each in communication with a respective switch, and wherein during an auto-zero stage, all of the plurality of PHASE signals are asserted such that current from all current sources flows through the diode, and during a sampling stage only one of the plurality of PHASE signals is asserted so that current from one current source flows through the diode. In some embodiments, the filter is not in communication with the sampling and gain boosting circuit during the auto-zero stage.

According to another embodiment, a temperature sensor is disclosed. The temperature sensor comprises a proportional to absolute temperature (PTAT) voltage generator, wherein the PTAT voltage generator comprises a diode and a plurality of current sources each with a respective switch such that when the switch is closed, current from the current source flows through the diode, and wherein a voltage at the diode is defined as $V_{diode}$; a sampling and boosting circuit comprising: an operational amplifier (opamp), an input capacitor having a first terminal in communication with $V_{diode}$ and a second terminal in communication with a negative input terminal of the opamp, a feedback capacitor having a first terminal in communication with the negative input terminal of the opamp and a second terminal in communication with an output terminal of the opamp, an output capacitor having a first terminal in communication with the output terminal of the opamp and a second terminal defined as Vout1, a feedback switch in parallel with the feedback capacitor, and an output switch having a first terminal in communication with the second terminal of the output capacitor and a second terminal connected to ground; a filter having Vout1 as an input and an analog voltage representative of temperature as an input; and a controller comprising a plurality of outputs to control the PTAT voltage generator and the sampling and gain boosting circuit. In some embodiments, the plurality of current sources comprises at least 4 current sources. In certain embodiments, the plurality of current sources comprises between 8 and 20 current sources. In some embodiments, the temperature sensor operates using an auto-zero stage and a sampling stage. In certain embodiments, the controller executes a plurality of auto-zero stages and sampling stages to obtain a temperature measurement. In some embodiments, the controller comprises a plurality of outputs referred to as PHASE signals, each in communication with a respective switch in the PTAT voltage generator. In certain embodiments, during the auto-zero stage, the controller closes the feedback switch and the output switch in the sampling and gain boosting circuit and wherein during the sampling stage, the controller opens the feedback switch and the output switch in the sampling and gain boosting circuit. In some embodiments, all of the PHASE signals are asserted during the auto-zero stage such that the PTAT voltage generator outputs a voltage referred to as Vref. In certain embodiments, during the sampling stage, the controller asserts one PHASE signal at a time so as to enable one current source and sequences through the PHASE signals one at a time until all current sources have been enabled; and wherein the sampling and gain boosting circuit creates a Vout1 voltage corresponding to each current source. In some embodiments, the filter is used to average all of the Vout1 voltages generated during the sampling stage. In certain embodiments, the filter comprises a filter switch and one or more low pass filters, wherein the filter switch comprises a first terminal in communication with Vout1 and a second terminal in communication with the one or more low pass filters. In some embodiments, the controller outputs a STORE signal used to control the filter switch and wherein the controller opens the filter switch during the auto-zero stage and toggles the filter switch during the sampling stage.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
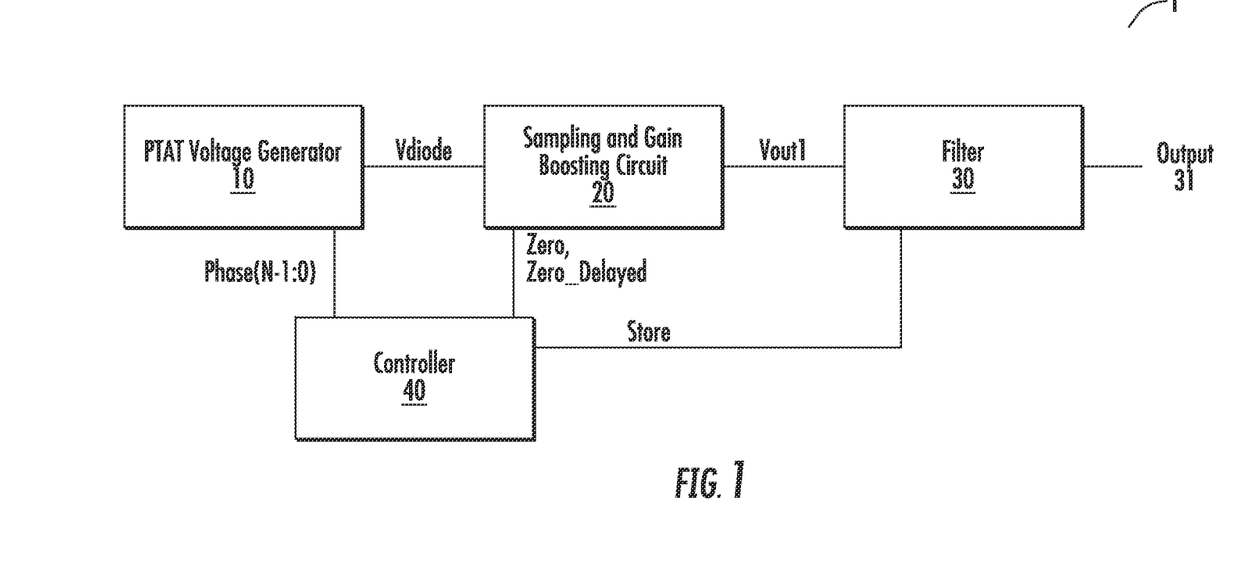
FIG. 1 shows an overview of the temperature sensor.

FIG. 1 shows an overview of the temperature sensor 1. The temperature sensor 1 comprises a proportional to absolute temperature (PTAT) voltage generator 10, a sampling and gain boosting circuit 20, a filter 30, and a controller 40.

The PTAT voltage generator 10 receives a plurality of PHASE signals, referred to as PHASE (N−1:0), from the controller 40. These PHASE signals determine the operation of the PTAT voltage generator 10 and the output that it generates. The output of the PTAT voltage generator 10 is referred to as $V_{diode}$.

The output from the PTAT voltage generator 10 is used as the input to the sampling and gain boosting circuit 20. The desired gain is an implementation decision, based on the desired resolution and output range. The sampling and gain boosting circuit 20 receives two inputs from the controller 40, a signal referred to as the ZERO signal, and a delayed version of the ZERO signal, referred to as the ZERO_DELAYED signal. The output from the sampling and gain boosting circuit is referred to as Vout1.

The output from the sampling and gain boosting circuit 20 is used as an input to the filter 30. The filter 30 also receives an input from the controller 40, referred to as the STORE signal. The output from the filter 30 is an analog voltage which is proportional to the absolute temperature.

The controller 40 may be a microcontroller, a processing unit or another processor. In these embodiments, the controller 40 may also include a memory comprising instructions that are executed by the processor. In other embodiments, the controller 40 may be a dedicated hardware state machine, which is not programmable. The controller 40 may receive a clock input. The controller 40 may also receive an enable signal which informs the controller 40 that a temperature measurement is requested. The controller 40 may not receive any inputs from the PTAT voltage generator 10, the sampling and gain boosting circuit 20 or the filter 30. Further, in all embodiments, the controller 40 is configured to output the PHASE, ZERO, ZERO_DELAYED and STORE signals in the manner described herein.

Figure 2:
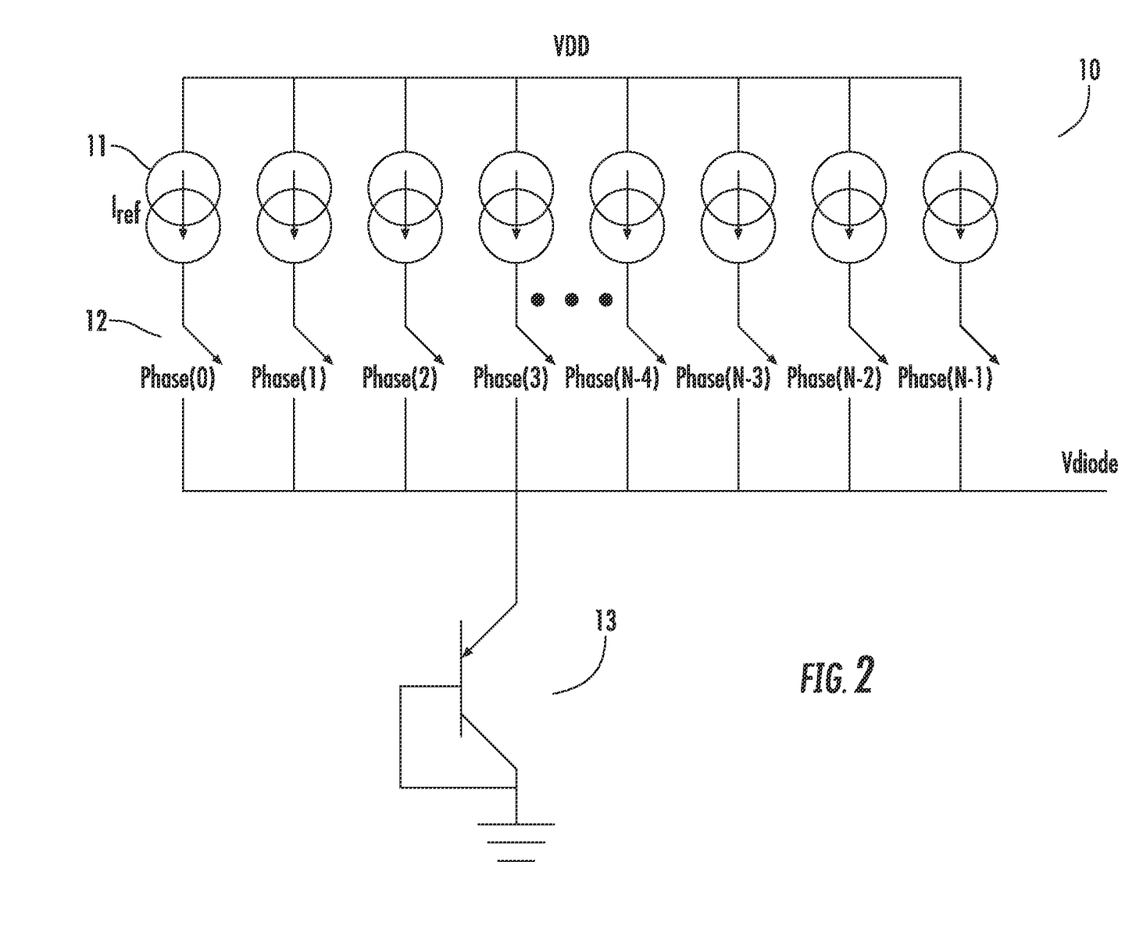
FIG. 2 shows the architecture of the PTAT voltage generator.

FIG. 2 shows an embodiment of the PTAT voltage generator 10. In this embodiment, there are a plurality of current sources 11, each configured to produce a predetermined amount of current, referred to as $I_{ref}$. The number of current sources 11, defined as N, may be any number greater than 4. In certain embodiments, the number of current sources 11 is greater than 10. In one particular embodiment, there are 14 current sources 11. In another embodiment, the number of current sources may be between 8 and 20. Each current source 11 is in series with a first terminal of a respective switch 12. The second terminal of each switch 12 is in communication with the diode 13. There are a plurality of PHASE signals provided by the controller 40 to the PTAT voltage generator 10, where the plurality of PHASE signals is equal to the plurality of current sources 11. Thus, there is a PHASE signal for each switch 12, wherein the state of the PHASE signal determines whether current flows from the respective current source 11 through the diode 13.

As is well known, the voltage across diode 13 can be described by the following equation:

$$V_{diode} \approx \frac{kT}{q} \ln\left(\frac{I}{I_0}\right)$$

Where k is Boltzmann's constant, T is the temperature in Kelvin, q is the electron charge, I is the current through the diode and $I_0$ is the saturation current of the diode.

Thus, when exactly one of the PHASE signals is asserted, the voltage across diode 13 can be written as:

$$V_{sampling} \approx \frac{kT}{q} \ln\left(\frac{I_{ref}}{I_0}\right)$$

The condition where one of the PHASE signals are asserted is referred to as the sampling stage and the output is referred to as a sampling voltage. Note that there are N different sampling voltages, determined by which of the N PHASE signals is asserted.

Assuming that the plurality of current sources 11 is defined as N current sources 11, where N is greater than 2, the voltage through the diode when all of the PHASE signals are asserted can be written as:

$$V_{reference} \approx \frac{kT}{q} \ln\left(\frac{N*I_{ref}}{I_0}\right)$$

The condition where all of the PHASE signals are asserted is referred to as the auto-zero stage and the output is referred to as the reference voltage.

The difference between the reference voltage and the sampling voltage can be written as:

$$\Delta V = V_{ref} - V_{sampling} \approx \frac{kT}{q}\ln\left(\frac{N*I_{ref}}{I_0}\right) - \frac{kT}{q}\ln\left(\frac{I_{ref}}{I_0}\right) \approx \frac{kT}{q}\ln(N)$$

Thus, the difference between the reference voltage and the sampling voltages is directly proportional to the absolute temperature. Further, it has no dependence on the saturation current of the diode 13 or the magnitude of the $I_{ref}$ current.

While one diode is shown in FIG. 2, it is understood that multiple diodes may be configured in series to increase the voltages described above.

Figure 3:
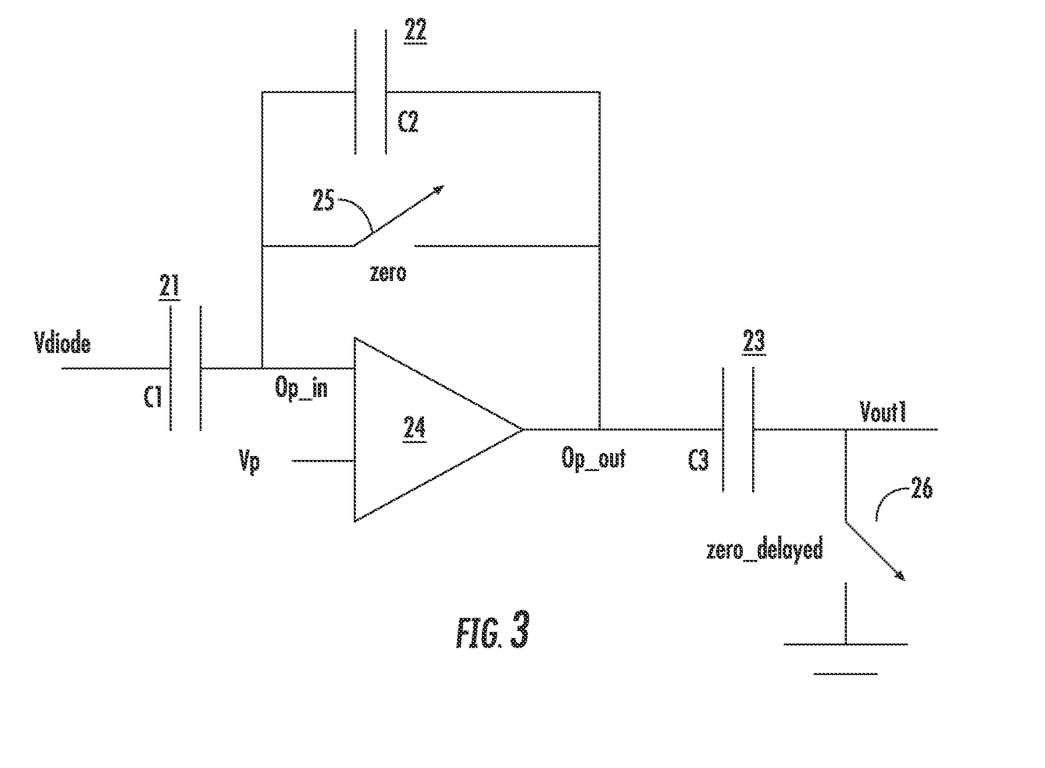
FIG. 3 shows the architecture of the sampling and gain boosting circuit.

FIG. 3 shows an embodiment of the sampling and gain boosting circuit 20. The circuit comprises an input capacitor 21, a feedback capacitor 22, and an output capacitor 23. The input capacitor 21 has a capacitance of C1, the feedback capacitor 22 has a capacitance of C2 and the output capacitor has a capacitance of C3. The output, $V_{diode}$ from the PTAT voltage generator 10 is electrically connected to the first terminal of the input capacitor 21.

Additionally, the circuit comprises an operational amplifier, or opamp 24. The opamp 24 has two input terminals. The positive input terminal is electrically connected to a fixed voltage, referred to as the pedestal voltage (Vp). In some embodiments, the pedestal voltage may be ground. The negative input terminal is electrically connected to a second terminal of the input capacitor 21 and the first terminal of the feedback capacitor 22. As such, the voltage at the negative input terminal of the opamp 24 may be written as $V_p+V_{os}$, wherein $V_{os}$ is the offset voltage between the two input terminals of the opamp 24. The second terminal of the feedback capacitor 22 is connected to the output of the opamp 24 and the first terminal of the output capacitor 23.

Additionally, a feedback switch 25 is in parallel with the feedback capacitor 22. This feedback switch 25 is closed when in the auto-zero stage and open all other times. Additionally, one terminal of an output switch 26 is electrically connected to the second terminal of the output capacitor 23. The second terminal of the output switch 26 is connected to ground.

The operation of the sampling and gain boosting circuit 20 will be described in reference to FIG. 3 and FIG. 5.

During the auto-zero stage, the ZERO signal is asserted and the ZERO_DELAYED signal is also asserted. This causes feedback switch 25 and output switch 26 to both be closed. Consequently, any charge across the feedback capacitor 22 is drained, so that there is no voltage across the feedback capacitor 22. Additionally, as stated above, the voltage at the negative input terminal of the opamp 24 is $V_p+V_{os}$, wherein $V_{os}$ is the offset voltage between the two input terminals of the opamp 24. Therefore, the voltage at the output terminal of the opamp 24 is also $V_p+V_{os}$.

Because of this, a voltage of $V_p+V_{os}$ exists across the output capacitor 23. During the auto-zero stage, all of the PHASE signals may be asserted. Thus, the voltage provided by the PTAT voltage generator 10 is the reference voltage, or $$V_{ref} \approx \frac{kT}{q} \ln\left(\frac{N*I_{ref}}{I_0}\right)$$

Thus, the voltage across the input capacitor 21 is equal to $V_{ref}-(V_p+V_{os})$.

Thus, the auto-zero stage is used to appropriately bias all of the capacitors in the sampling and gain boosting circuit 20.

At a later time, the temperature sensor enters sampling mode. In this sampling mode, the ZERO and ZERO_DELAYED signals are no longer asserted. Thus, the feedback switch 25 and the output switch 26 are open and no longer affect the operation of the sampling and gain boosting circuit 20.

During the sampling mode, one PHASE signal is asserted at a time. Thus, the voltage that is output by the PTAT voltage generator 10 is now a sampling voltage, defined as $$V_{sampling} \approx \frac{kT}{q} \ln\left(\frac{I_{ref}}{I_0}\right).$$

Stated differently, the output of the PTAT voltage generator can be defined as $V_{ref}-(V_{ref}-V_{sampling})$ or $V_{ref}-\Delta V$.

Since the voltage across the input capacitor 21 was previously $V_{ref}-(V_p+V_{os})$, there is now a change in voltage, which results in a current through the input capacitor 21 having an integral equal to $C1*\Delta V$. This instantaneous current then flows through the feedback capacitor 22. Thus creates a voltage across the feedback capacitor 22 that is equal to $$\frac{C1}{C2}\Delta V + V_p + V_{os}.$$

Note that the output capacitor 23 was previously charged with a voltage equal to $V_p+V_{os}$ during the auto-zero stage. Thus, the output of the sampling and gain boosting circuit 20 is simply $$\frac{C1}{C2}\Delta V.$$

Note that the pedestal voltage and the offset voltage associated with the opamp 24 are eliminated by the output capacitor 23.

Further, the sampling and gain boosting circuit 20 is insensitive to parasitic capacitance. Parasitic capacitance may exist on either side of the input capacitor 21. However, the PTAT voltage generator 10 drives an output, so any parasitic capacitance on the input side of the input capacitor 21 is inconsequential. Similarly, the output side of the input capacitor is tied to virtual ground and is also inconsequential. Additionally, parasitic capacitance may exist on either side of the output capacitor 23. The input side of output capacitor 23 is driven by the opamp 24, so any parasitic capacitance is inconsequential. Parasitic capacitance at the output of the output capacitor 23 may affect the gain by a ratio of $$\frac{C3}{C3+Cp4},$$

where Cp4 is the parasitic capacitance at the output of the output capacitor 23. Since C3 is much larger than the parasitic capacitance, this effect is minimal.

Figure 4:
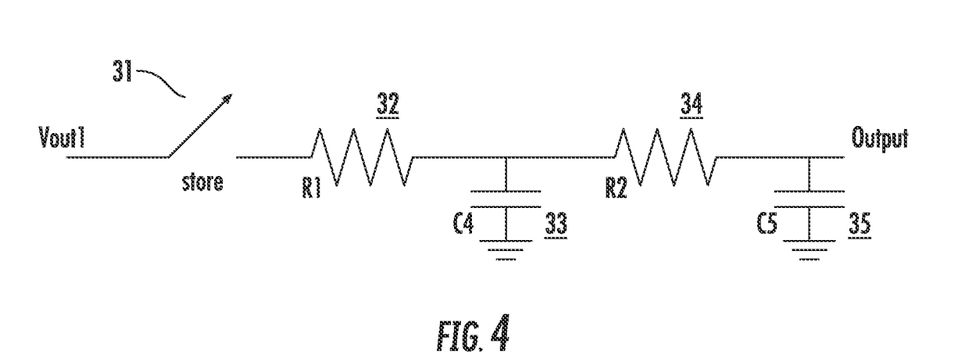
FIG. 4 shows the architecture of the filter.

The temperature sensor 1 also include a filter 30, as shown in FIG. 4. The filter 30 comprises a filter switch 31, and two low pass filters. The first low pass filter is created by the first resistor 32 and the intermediate capacitor 33. The second low pass filter is created by second resistor 34 and the final capacitor 35. The number of low pass filters is not required to be two. Rather, any sufficiently large low pass filter may suffice. Therefore, there may be fewer than or more than two low pass filters.

The filter switch 31 is controlled by a STORE signal from the controller 40. When asserted, the STORE signal allows the voltage present at the output of the sampling and gain boosting circuit 20 to be passed to the filter 30. When deasserted, the STORE signal prevents the voltage present at the output of the sampling and gain boosting circuit 20 from being passed to the filter 30.

Figure 5:
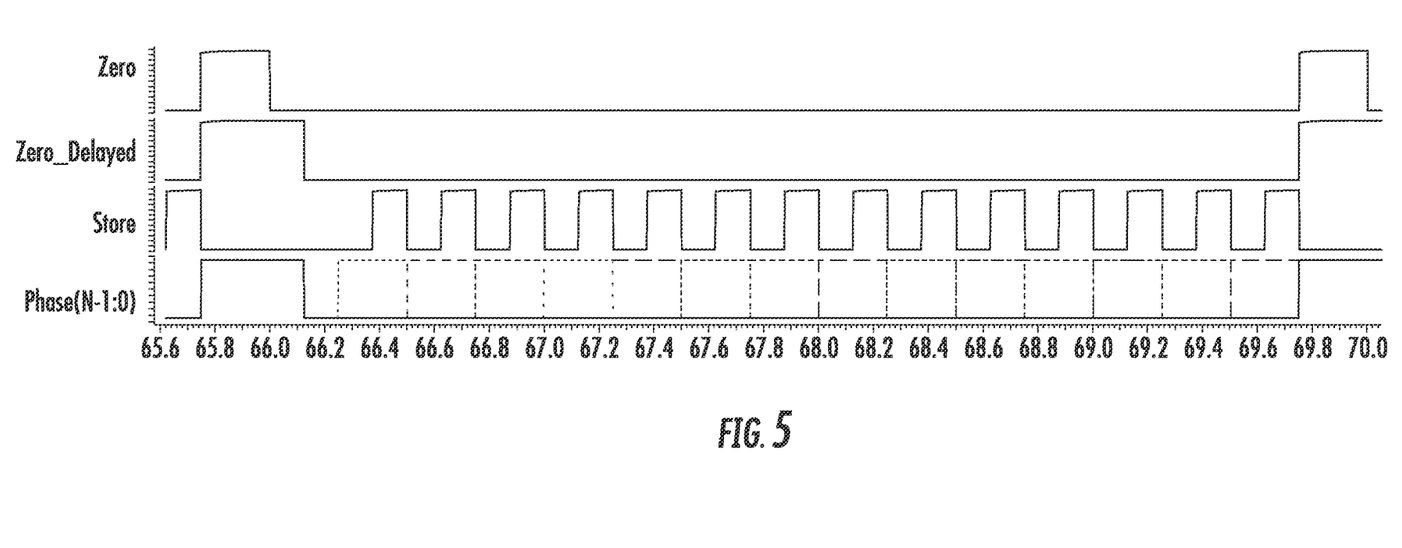
FIG. 5 shows a diagram showing the timing of all of the control signals.

Note in FIG. 5, that the STORE signal is not asserted during the auto-zero stage. Rather, the STORE signal is asserted during sampling mode. In certain embodiments, the PHASE signals are changed at a constant frequency during sampling mode, and the STORE signal is asserted after the PHASE signals transition to allow the opamp 24 to settle. Further, the STORE signal may be deasserted before the next transition of the PHASE signals. In certain embodiments, the duration of the STORE signal, when asserted, is constant. For example, FIG. 5 shows the STORE signal is asserted during for a duration that is equal to roughly 50% of the time that the PHASE signals are stable.

Figure 6:
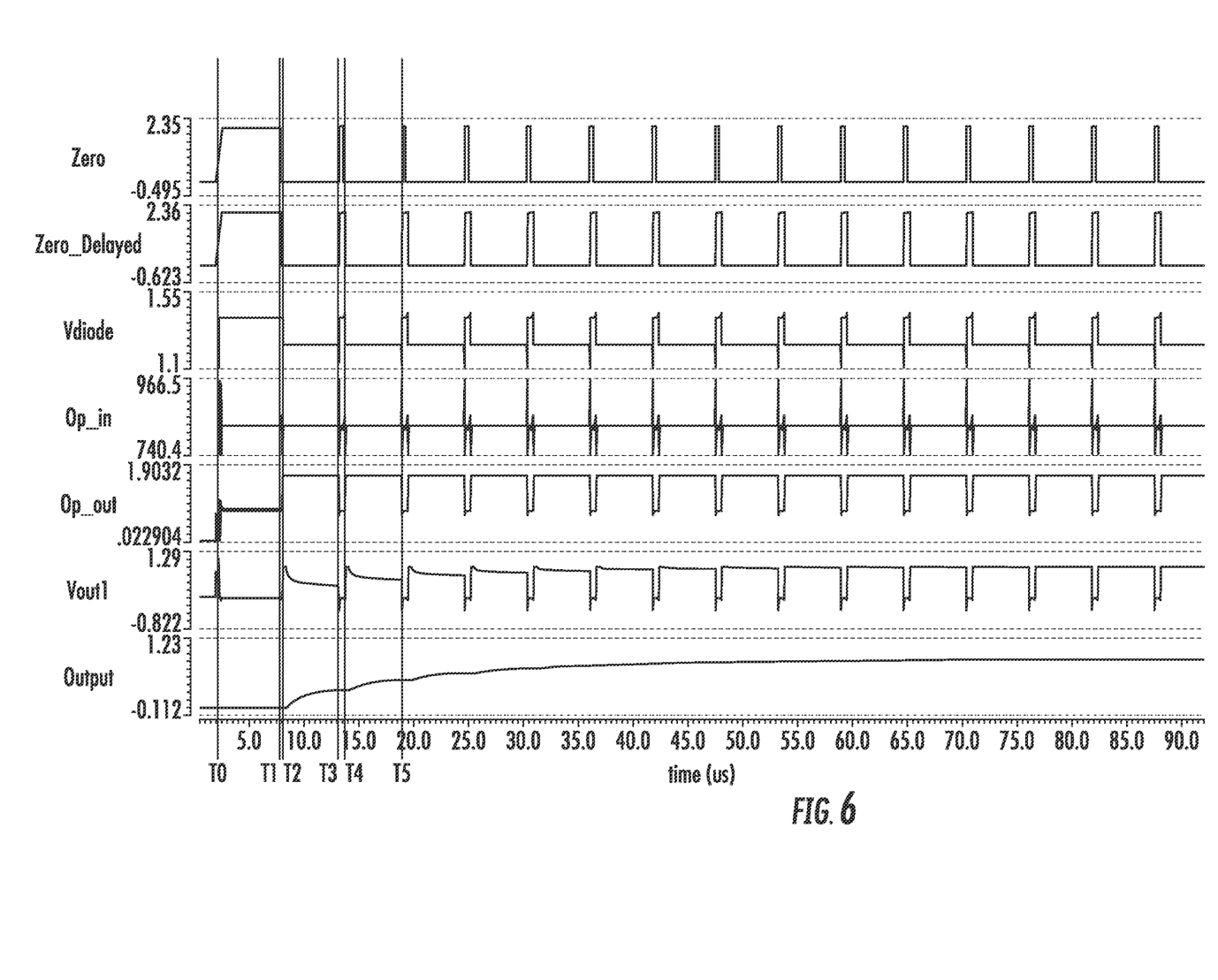
FIG. 6 is a timing diagram showing the operation of the temperature sensor.

FIG. 6 shows a timing diagram with various signals, including some provided by the controller 40 and several analog voltages. As shown at time T0, the ZERO signal and the ZERO_DELAYED signal are asserted by the controller 40. Although not shown, the STORE signal is not asserted at this time. As described above, this defines the auto-zero stage. The output from the PTAT voltage generator 10 is now $V_{ref}$. Further, feedback switch 25 and output switch 26 are both closed. Thus, the Op_in and Op_out signals are at the same voltage. Further, the voltage across the feedback capacitor 22 is drained to 0 volts, while the voltage across the output capacitor 23 is charged to $V_p+V_{os}$ volts.

At time T1, the ZERO signal is deasserted and the feedback switch 25 opens. At initialization, it may be that the auto-zero stage lasts longer than during normal operation. For example, it may be necessary to have the auto-zero stage last until the opamp 24 settles. In some embodiments, the auto-zero time at startup may be between 4 and 8 microseconds, although other durations may also be used. Since the output from the PTAT voltage generator 10 is not changed, no charge accumulates on the feedback capacitor 22 at this time.

At time T2, the ZERO_DELAYED signal is deasserted and the PHASE signals are also changed. The ZERO_DELAYED signal is delayed from the ZERO signal to ensure that the offset voltage of the opamp 24 is not propagated to the filter 30. Note that the $V_{diode}$ output drops, because only one current source 11 is enabled. Thus the output from the PTAT voltage generator 10 is now $V_{sampling}$. Further, as explained above, the change in $V_{diode}$ causes current to pass through the feedback capacitor 22 and the input capacitor 21, resulting in a change in the voltage at the output terminal of the opamp 24, as seen in the Op_out signal.

The period of time between T2 and T3 is referred to as the sampling stage. During the sampling stage, the controller 40 cycles through each of the current sources 11 by asserting each PHASE signal in sequence. In addition, the controller 40 also asserts the STORE signal for each PHASE signal so that charge can be transferred from the sampling and gain boosting circuit 20 to the filter 30.

FIG. 5 shows an expanded view of the control signals that occur between T2 and T3. As can be seen, each PHASE signal is asserted for a predetermined duration of time. In some embodiments, the PHASE signals are changed at a frequency of between 1 and 5 MHz. During each predetermined duration of time, the controller 40 asserts the STORE signal.

During the period immediately after startup, charge sharing between the output capacitor 23, the intermediate capacitor 33 and the final capacitor 35 causes the Vout1 signal to decay, as seen in the period between T2 and T3.

During the period between T3 and T4, another auto-zero stage is performed. As described above, the output from the PTAT voltage generator 10 during the auto-zero stage is $V_{ref}$, and the feedback switch 25 and output switch 26 are closed. In certain embodiments, the initial auto-zero stage after reset is longer in duration than subsequent auto-zero stages. For example, during normal operation, the auto-zero stage may last 0.5 microseconds or less.

After the second auto-zero stage, another sampling stage is performed between T4 and T5. The sequence of performing an auto-zero stage followed by a sampling stage may be repeated a number of times until the final capacitor 35 is sufficiently charged. In certain embodiments, a total of 10 to 15 sampling stages is performed for each temperature measurement. Of course, the number of sampling stages may vary based on the size of the capacitors in the filter 30. Specifically, the number of sample stages may be related to the ratio of the duration of the STORE signal to the time constants of the low pass filters. A sufficient number of sample stages is that which allows the output voltage to settle to within a desired error from the voltage which would appear if a much larger time were allowed. For example, in certain embodiments, allowing settling to within 0.1° C. would be sufficient.

Figure 7:
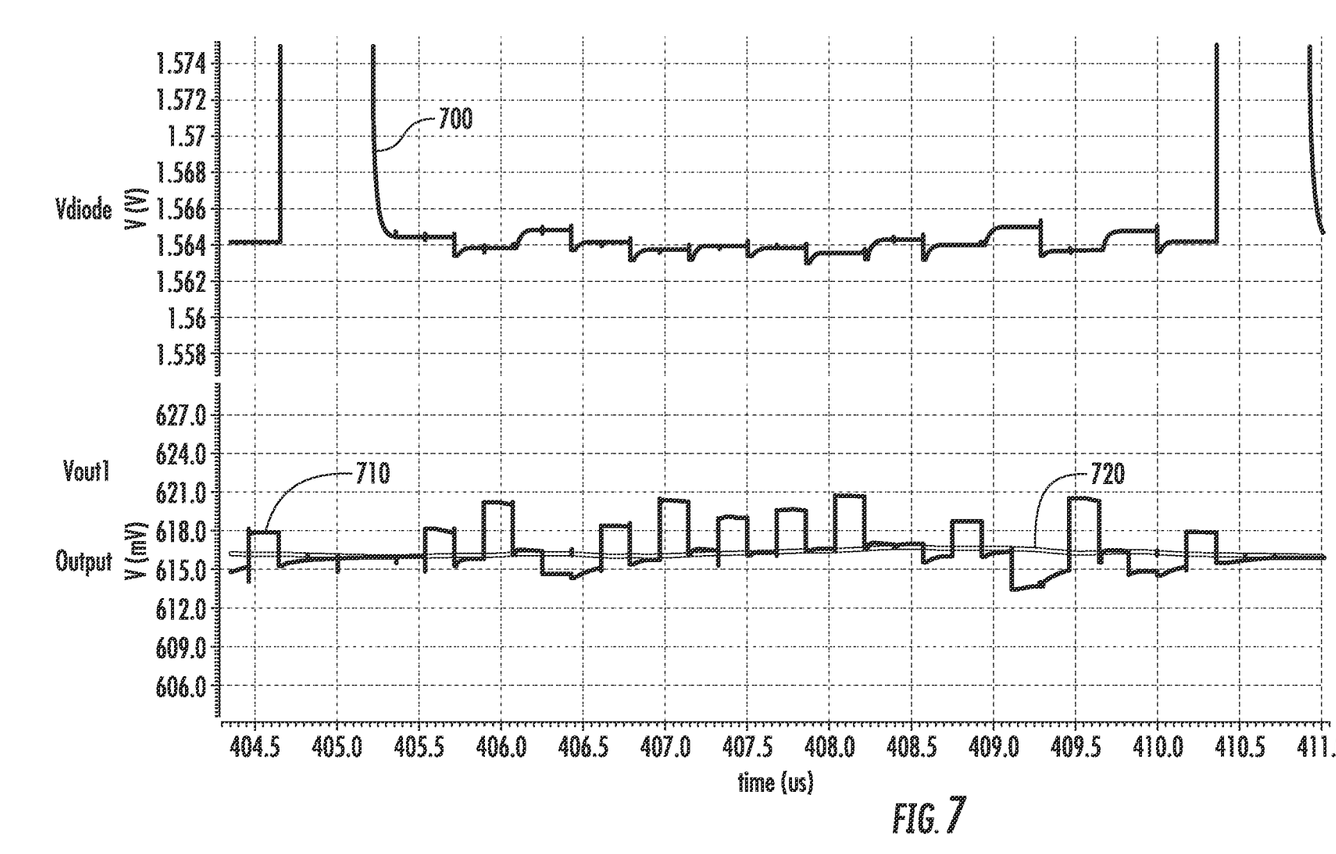
FIG. 7 is a timing diagram showing the voltage generated by the temperature sensor over a shorter duration.

FIG. 7 shows the benefits of utilizing filter 30. As seen in FIG. 7, during the auto-zero stage, the $V_{diode}$ output 700 is much greater than during the sampling stage. FIG. 7 shows 14 current sources, each selected in sequence. Because the matching of the current sources 11 is not ideal, there is variation of the $V_{diode}$ signal each time the PHASE signals are changed.

These variations are also reflected in the Vout1 output 710. Further, because the Vout1 signal passes through a low pass filter, the output signal 720 is smoothed and represents the average value of the Vout1 signal 710 during the 14 samples. The use of multiple current sources and the averaging function of the filter 30 result in a more accurate result, which is less sensitive to process and mismatch.

In fact, in one simulation, it was determined that the accuracy of the temperature sensor was within 1.5° C. over the full range of process variation after a one temperature calibration process was performed.

Figure 8:
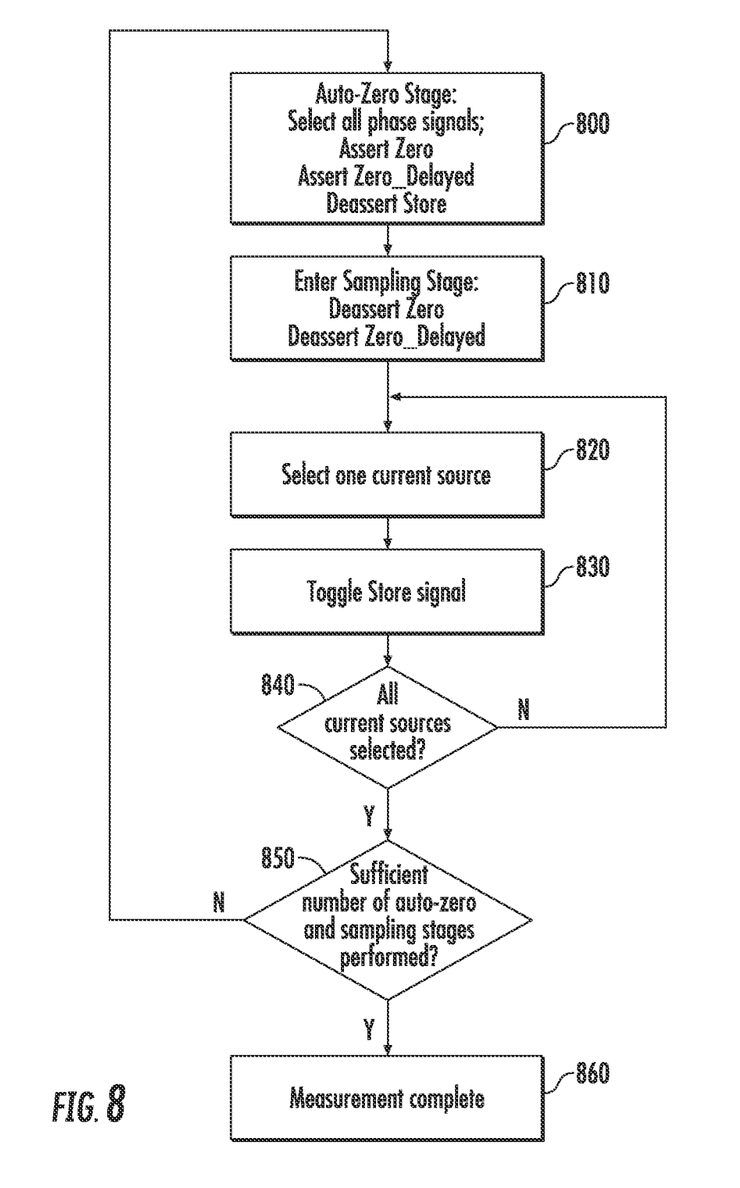
FIG. 8 illustrates the operation of the controller.

Thus, by selecting the various current sources, and properly sampling the sampling voltages, a more accurate temperature sensor may be realized. FIG. 8 shows the operation of the controller 40 according to one embodiment. First, as shown in Box 800, the controller 40 enters auto-zero stage. In the auto-zero stage, all current sources are selected by asserting all of the PHASE signals. Additionally, the ZERO and ZERO_DELAYED signals are asserted to create the desired initial charges on the input capacitor 21, the feedback capacitor 22 and the output capacitor 23. Further, the STORE signal is deasserted so that the output is unaffected by the auto-zero stage. As stated above, the auto-zero stage may have a duration of 0.5 microseconds or less.

After the auto-zero stage, the controller 40 begins the sampling stage, as shown in Box 810. At this time, the ZERO signal and the ZERO_DELAYED signal are deasserted.

The controller 40 then selects one of the current sources 11, as shown in Box 820. After selecting a current source, the controller 40 then asserts the STORE signal to allow the Vout1 from the sampling and gain boosting circuit 20 to be passed to the filter 30. Before changing the PHASE signals, the controller 40 then deasserts the STORE signal. Thus, during the selection of each current source 11, the controller 40 toggles the STORE signal, as shown in Box 830. In certain embodiments, the duration that the STORE signal is asserted is the same for each current source 11.

The controller 40 then determines whether it has sampled each of the current sources yet, as shown in Box 840. If all of the current sources have not been sampled yet, the controller 40 returns to Box 820. If all of the current sources have been sampled, the controller 40 continues to Box 850, where it checks whether a sufficient number of auto-zero and sampling stages have been performed. The number of auto-zero and sampling stages determines how accurate the filtered output voltage will be. In some embodiments, at least 10 auto-zero and sampling stages are performed for each temperature measurement. If a sufficient number of auto-zero and sampling stages have not been performed, the controller 40 returns to Box 800. If a sufficient number of auto-zero and sampling stages have been performed, the temperature measurement is complete, as shown in Box 860.

While the above disclosure describes the sampling stage as having only one current source enabled at a time, other embodiments are possible. For example, in certain embodiments, the sampling stage may be performed by asserting 2 PHASE signals at a time. In fact, the sampling stage may be performed by enabling any number of current sources, as long as the number is less than N.

This temperature sensor has many advantages. By utilizing the same diode 13, mismatch between different diodes can be avoided. Further, by utilizing a plurality of current sources and averaging the results, mismatch between current sources can be minimized. Additionally, the current temperature sensor is insensitive to parasitic capacitance, as described above. This results in a highly accurate temperature sensor that maintains its accuracy across the full range of process parameters and temperature range. Further, if a one temperature calibration process is performed, the accuracy of the temperature sensor may be improved to within 1.5° C.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A temperature sensor comprising:
a proportional to absolute temperature (PTAT) voltage generator, to generate a reference voltage during an auto-zero stage and a plurality of sampling voltages during a sampling stage, wherein a difference between the reference voltage and each of the plurality of sampling voltages is defined as a ΔV voltage;
a sampling and gain boosting circuit to amplify a plurality of ΔV voltages; and
a filter to average the plurality of ΔV voltages.

2. The temperature sensor of claim 1, wherein the PTAT voltage generator comprises a diode and a plurality of current sources each with a respective switch such that when the switch is closed, current from the current source flows through the diode, and wherein when all of the respective switches are closed, the reference voltage is generated.

3. The temperature sensor of claim 2, wherein the plurality of current sources comprises at least 4 current sources.

4. The temperature sensor of claim 2, wherein the plurality of current sources comprises between 8 and 20 current sources.

5. The temperature sensor of claim 2, wherein when one switch is closed, one of the plurality of sampling voltages is generated.

6. The temperature sensor of claim 2, further comprising a controller, wherein the controller generates a plurality of PHASE signals, each in communication with a respective switch, and wherein during an auto-zero stage, all of the plurality of PHASE signals are asserted such that current from all current sources flows through the diode, and during a sampling stage only one of the plurality of PHASE signals is asserted so that current from one current source flows through the diode.

7. The temperature sensor of claim 6, wherein the filter is not in communication with the sampling and gain boosting circuit during the auto-zero stage.

8. A temperature sensor, comprising:
a proportional to absolute temperature (PTAT) voltage generator, wherein the PTAT voltage generator comprises a diode and a plurality of current sources each with a respective switch such that when the switch is closed, current from the current source flows through the diode, and wherein a voltage at the diode is defined as $V_{diode}$;
a sampling and boosting circuit comprising:
an operational amplifier (opamp),
an input capacitor having a first terminal in communication with $V_{diode}$ and a second terminal in communication with a negative input terminal of the opamp,
a feedback capacitor having a first terminal in communication with the negative input terminal of the opamp and a second terminal in communication with an output terminal of the opamp,
an output capacitor having a first terminal in communication with the output terminal of the opamp and a second terminal defined as Vout1,
a feedback switch in parallel with the feedback capacitor, and
an output switch having a first terminal in communication with the second terminal of the output capacitor and a second terminal connected to ground;
a filter having Vout1 as an input and an analog voltage representative of temperature as an input; and
a controller comprising a plurality of outputs to control the PTAT voltage generator and the sampling and gain boosting circuit.

9. The temperature sensor of claim 8, wherein the plurality of current sources comprises at least 4 current sources.

10. The temperature sensor of claim 8, wherein the plurality of current sources comprises between 8 and 20 current sources.

11. The temperature sensor of claim 8, wherein the temperature sensor operates using an auto-zero stage and a sampling stage.

12. The temperature sensor of claim 11, wherein the controller executes a plurality of auto-zero stages and sampling stages to obtain a temperature measurement.

13. The temperature sensor of claim 11, wherein the controller comprises a plurality of outputs referred to as PHASE signals, each in communication with a respective switch in the PTAT voltage generator.

14. The temperature sensor of claim 13, wherein during the auto-zero stage, the controller closes the feedback switch and the output switch in the sampling and gain boosting circuit and wherein during the sampling stage, the controller opens the feedback switch and the output switch in the sampling and gain boosting circuit.

15. The temperature sensor of claim 14, wherein all of the PHASE signals are asserted during the auto-zero stage such that the PTAT voltage generator outputs a voltage referred to as Vref.

16. The temperature sensor of claim 13, wherein during the sampling stage, the controller asserts one PHASE signal at a time so as to enable one current source and sequences through the PHASE signals one at a time until all current sources have been enabled; and wherein the sampling and gain boosting circuit creates a Vout1 voltage corresponding to each current source.

17. The temperature sensor of claim 16, wherein the filter is used to average all of the Vout1 voltages generated during the sampling stage.

18. The temperature sensor of claim 11, wherein the filter comprises a filter switch and one or more low pass filters, wherein the filter switch comprises a first terminal in communication with Vout1 and a second terminal in communication with the one or more low pass filters.

19. The temperature sensor of claim 18, wherein the controller outputs a STORE signal used to control the filter switch and wherein the controller opens the filter switch during the auto-zero stage and toggles the filter switch during the sampling stage.

* * * * *